United States Patent
Eshun (10) Patent No.: US 8,680,618 B2
(45) Date of Patent: Mar. 25, 2014

(54) STRUCTURE AND METHOD FOR INTEGRATING FRONT END SICR RESISTORS IN HIK METAL GATE TECHNOLOGIES

(71) Applicant: Texas Instruments Incorporated, Dallas, TX (US)

(72) Inventor: Ebenezer Eshun, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/654,015

(22) Filed: Oct. 17, 2012

(65) Prior Publication Data

US 2013/0093024 A1 Apr. 18, 2013

Related U.S. Application Data

(60) Provisional application No. 61/547,964, filed on Oct. 17, 2011.

(51) Int. Cl.
*H01L 27/12* (2006.01)
*H01L 49/02* (2006.01)
*H01L 29/8605* (2006.01)

(52) U.S. Cl.
CPC ............ *H01L 28/20* (2013.01); *H01L 29/8605* (2013.01)

USPC .......................................... 257/350; 438/382

(58) Field of Classification Search
CPC ......... H01L 21/02; H01L 28/10; H01L 27/06; H01L 27/0288; H01L 27/0629; H01L 27/0617; H01L 27/0251; H01L 27/0218; H01L 27/0225; H01L 28/20
USPC ......... 438/171, 190, 210, 238, 329, 381, 382, 438/384; 257/350, 358, 360, 363, 571, 257/E29.001, E21.003
See application file for complete search history.

(56) References Cited

U.S. PATENT DOCUMENTS

| | | | |
|---|---|---|---|
| 2006/0027892 A1* | 2/2006 | Yamashita et al. ............. | 257/536 |
| 2006/0065949 A1* | 3/2006 | Kato et al. .................... | 257/532 |
| 2006/0181388 A1* | 8/2006 | Chinthakindi et al. ........ | 338/309 |
| 2008/0132056 A1* | 6/2008 | Beach .......................... | 438/620 |

* cited by examiner

*Primary Examiner* — Brook Kebede
(74) *Attorney, Agent, or Firm* — Jacqueline J. Garner; Wade J. Brady, III; Frederick J. Telecky Jr.

(57) ABSTRACT

An integrated circuit having a replacement HiK metal gate transistor and a front end SiCr resistor. The SiCr resistor replaces the conventional polysilicon resistor in front end processing and is integrated into the contact module. The first level of metal interconnect is located above the SiCr resistor. First contacts connect to source/drain regions. Second contacts electrically connect the first level of interconnect to either the SiCr resistor or the metal replacement gate.

18 Claims, 13 Drawing Sheets

STRUCTURE AND METHOD FOR INTEGRATING FRONT END SICR RESISTORS IN HIK METAL GATE TECHNOLOGIES

FIELD OF THE INVENTION

The invention is generally related to the field of integrated circuits and more specifically to replacing conventional polysilicon resistors with front end SiCr resistors in metal HiK replacement gate technologies.

BACKGROUND OF THE INVENTION

An integrated circuit may be formed by replacing polycrystalline silicon (polysilicon) in gates of metal oxide semiconductor (MOS) transistors with metal, a process commonly referred to as replacement gate. In conventional polysilicon gate transistors, the polysilicon layer used to form the gate may also be used to form a polysilicon resistor. Integrating the polysilicon resistor into the integrated circuit fabrication sequence for replacement gate technologies that provides a desired control over resistor properties without unduly increasing cost and complexity of the fabrication sequence may be problematic

SUMMARY OF THE INVENTION

The invention overcomes the concerns regarding the use of a polysilicon resistor in replacement gate technologies by replacing the convention polysilicon resistor with a front end SiCr resistor. After replacing the disposable gate with the replacement metal gate and prior to forming the first metal interconnect level, a SiCr resistor is formed. Contacts are formed below the first metal interconnect level through a dielectric layer to contact the ends of the SiCr resistor. Additional contacts connect to the replacement metal gate.

An advantage of the invention is providing a front end resistor in a replacement metal gate technology that matches the characteristics of a polysilicon resistor with improved resistor tolerance control.

This and other advantages will be apparent to those of ordinary skill in the art having reference to the specification in conjunction with the drawings.

DETAILED DESCRIPTION OF THE EMBODIMENTS

The invention will now be described in conjunction with an exemplary replacement gate. It will be apparent to those of ordinary skill in the art that the invention may be practiced with alternative replacement gate technologies as the SiCr resistor and its formation are independent of the transistor device (e.g., gate, source/drain) fabrication sequence.

Figure 1:
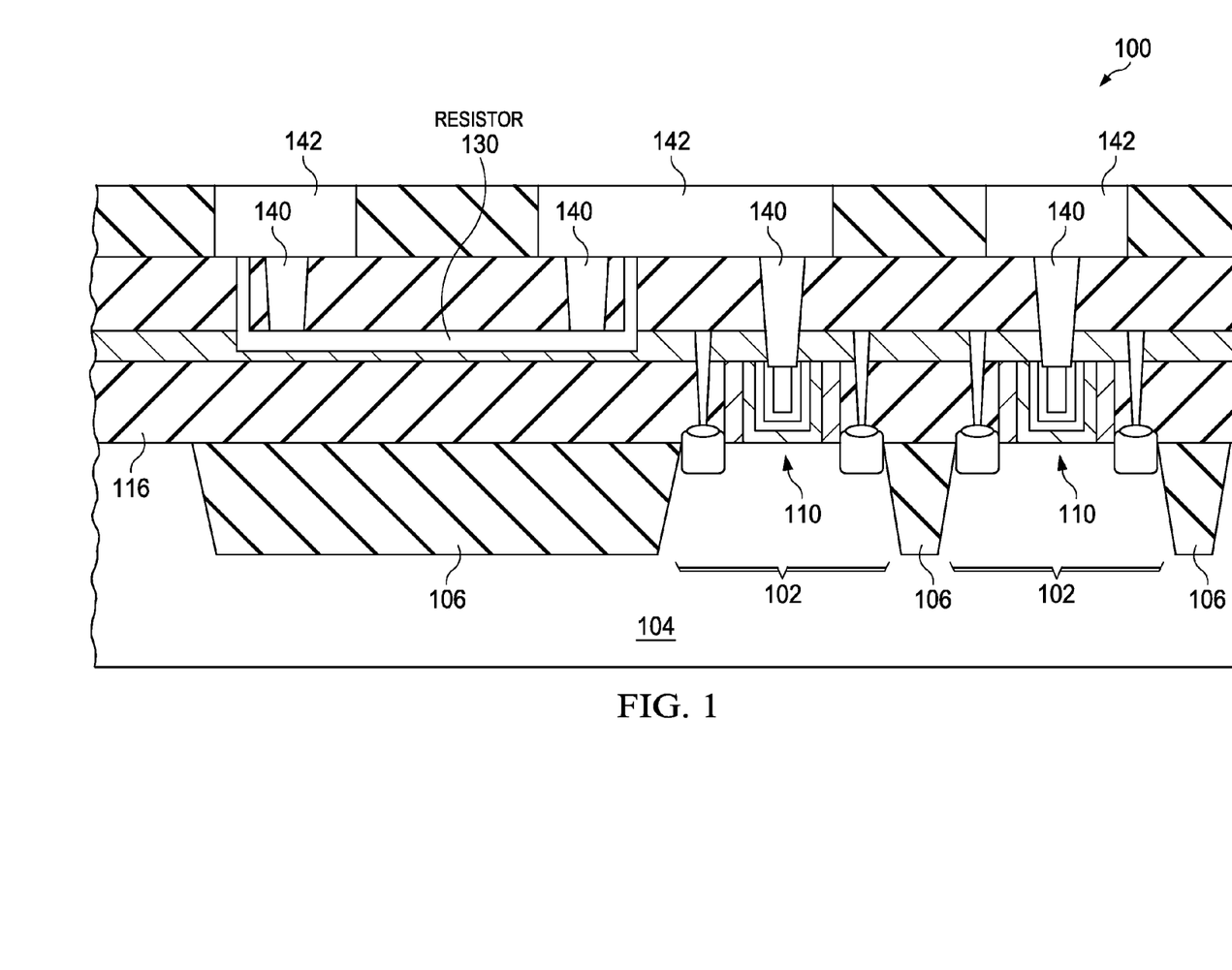
FIG. 1 is a cross-sectional diagram of an integrated circuit with a replacement gate transistor and a front end SiCr resistor according to the invention.

FIG. 1 illustrates an integrated circuit 100 having a replacement HiK metal gate transistor 102 formed in a semiconductor substrate 104 and a SiCr resistor 130 formed over the substrate 104. Integrated circuit 100 includes isolation regions 106 located in substrate 104. Isolation regions 104 may, for example, comprise shallow trench isolation (STI). The first metal interconnect level 142 is formed over the SiCr resistor 130 and the replacement gate transistor 102. Contacts 104 extend from the first metal interconnect level 142 to the SiCr resistor 130 and to the replacement gate 110 of the transistor 102.

SiCr resistor 130 is a front end of line (FEOL) resistor designed to replace a conventional polysilicon resistor. For easier design migration from prior nodes, SiCr resistor 130 is manufactured to have film properties similar to polysilicon resistors (e.g., Rs>300 ohms/sq, TCR~200 ppm/° C., capable of providing a zero TCR solution, and low 1/f noise). By placing the SiCr resistor 130 in the FEOL, the same contact mask may be used to contact the SiCr resistor 130 and the replacement gate 110 (similar to conventional polysilicon resistors). For reliability, FEOL placement results in less self-heating and hence higher current capability.

Figure 2:
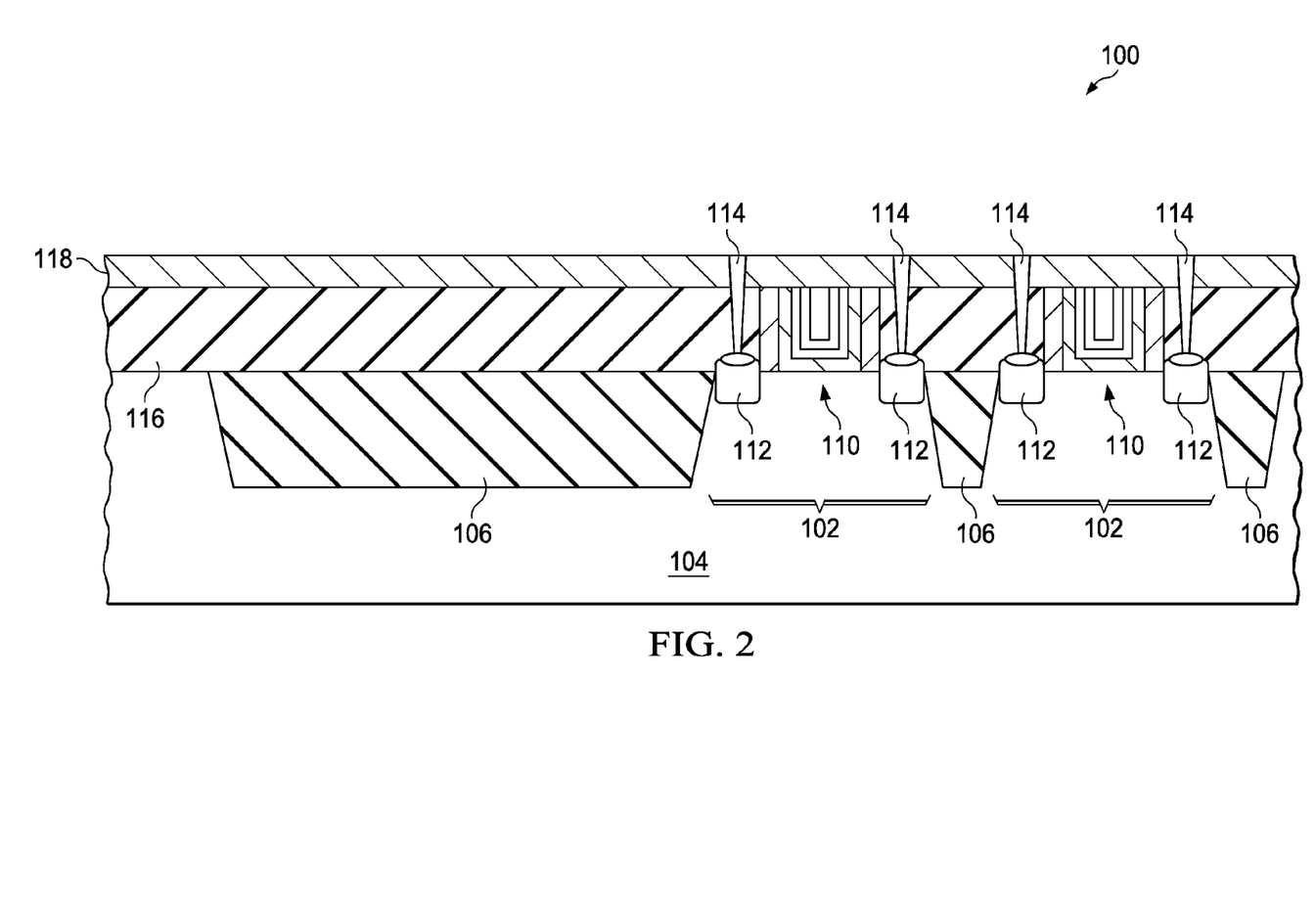
FIGS. 2, 3, 4A, 4B, 5A, 5B, and 6 are cross-section diagram of the integrated circuit of FIG. 1 at various stages of fabrication.

Integration of a front end SiCr resistor 130 into the contact module of a replacement gate process will now be discussed with reference to FIGS. 2-6. Referring to FIG. 2, integrated circuit 100 is processed through the formation of replacement gate transistor 102 and first contact 114 to the source/drain regions 112. The substrate 104 may be a single crystal silicon wafer, a silicon-on-insulator (SOD wafer, a hybrid orientation technology (HOT) wafer with regions of different crystal orientations, or other material appropriate for fabrication of the integrated circuit 100. Elements of field oxide 106 are formed at a top surface of the substrate 104, for example, of silicon dioxide 200 to 350 nanometers thick, commonly by shallow trench isolation (STI).

Transistor 102 is formed using a replacement HiK metal gate process. For example, a disposable gate (typically polysilicon) is formed, followed by the formation of sidewall spacers and source/drain regions 112. A pre-metal dielectric (PMD) layer 116 may be deposited and planarized using a chemically-mechanically polish (CMP). The CMP step exposes the disposable gate. Thereafter, the disposable gate is removed and replaced with the replacement metal gate 110. A gate dielectric layer may also be removed and replaced with a HiK gate dielectric layer. HiK refers to a high dielectric constant. The HiK gate dielectric layer may include, for example, hafnium oxide, hafnium silicate, hafnium silicon oxy-nitride, zirconium oxide, zirconium silicate, zirconium silicon oxy-nitride. The metal replacement gate 110 may include, for example, titanium nitride and/or titanium aluminum nitride After forming metal replacement gate 110, an etch stop layer 118 such as SiN is deposited over the surface. Contact holes are formed through the etch stop later 118 and PMD 116 to expose the surface of source/drain regions 112. The exposed surface is silicided and the contact holes are filled to form first contacts 114.

Although a specific replacement gate process has been discussed, other replacement gate processes are possible without departing from the scope of the invention. One advantage of the invention is that it may be used with a variety of replacement gate processes. In addition, changes to the replacement gate process do not require re-engineering of the SiCr resistor 130 formation.

Figure 3:
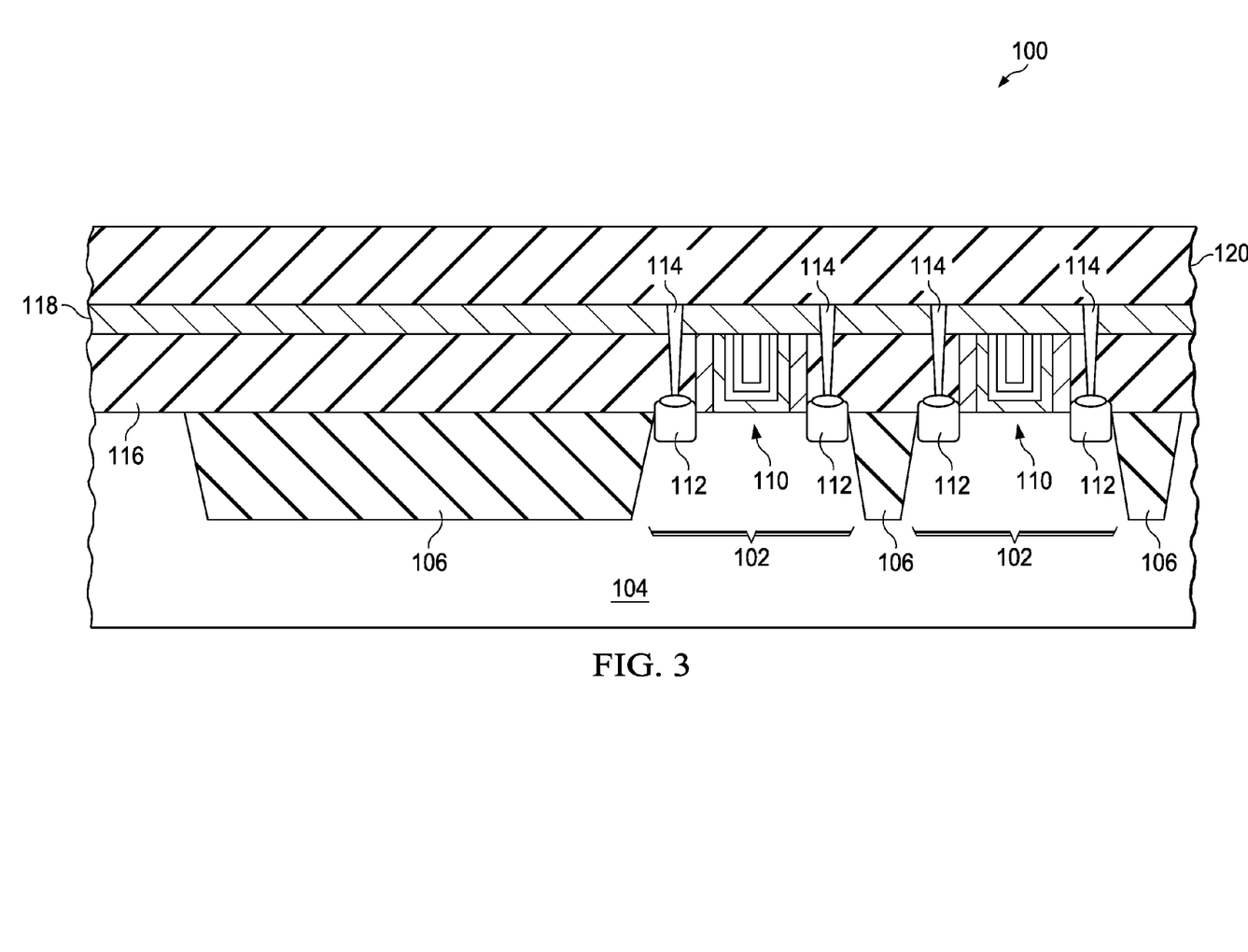

Referring to FIG. 3, a dielectric layer 120 is deposited to a thickness greater than that ultimately desired in order to account for the resistor formation. For example, the thickness may be 600 Å to 800 Å. Dielectric layer 120 comprises a material suitable as an interlevel dielectric or PMD. For example, silicon dioxide formed by chemical vapor deposition (CVD), plasma enhanced chemical vapor deposition (PECVD) using tetraethyl orthosilicate, also known as tetraethoxysilane or TEOS, low pressure chemical vapor deposition (LPCVD), atmospheric pressure chemical vapor deposition (APCVD), high density plasma (HDP), or an ozone based thermal chemical vapor deposition (CVD) process, also known as the high aspect ratio process (HARP), a spin-on dielectric such as methylsilsesquioxane (MSQ), or other suitable dielectric layer formation process may be used.

Figure 4A:
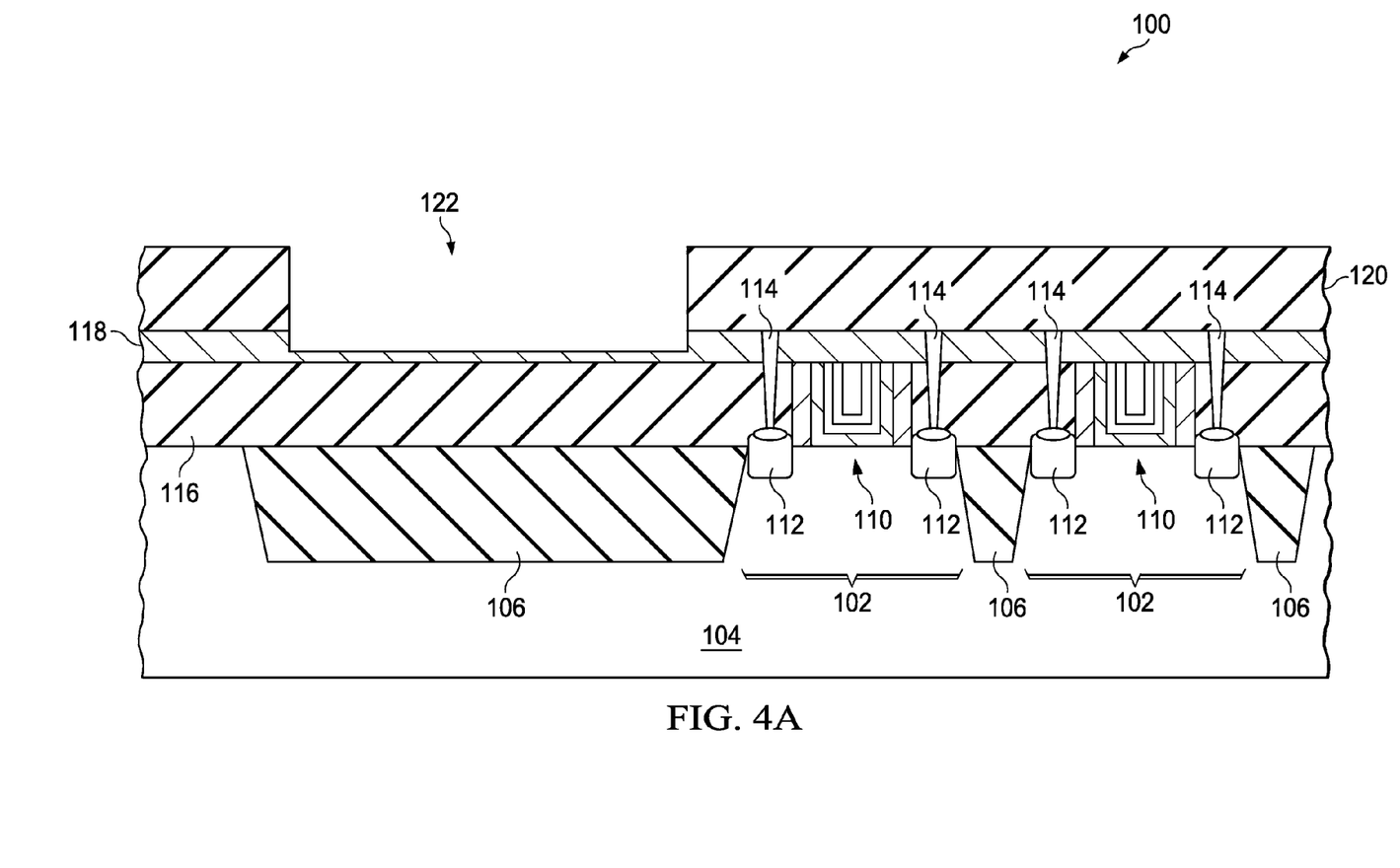

Referring to FIG. 4A, a resistor trench 122 is etched through dielectric layer 120. Resistor trench 122 may be etched into etch stop layer 110 as shown or may actually extend into PMD 116. The depth of resistor trench 122 may be on the order of 700 Å. This depth may be adjusted depending on the desired thickness of the subsequently deposited resistor material and for topography reasons. Resistor trench 122 may be formed by providing a photoresist pattern and etching using, for example, reactive ion etching (RIE). Suitable etch chemistries include fluorine based chemistries such as $SF_6$, $CF_4$, and $CHF_3$.

Figure 4B:
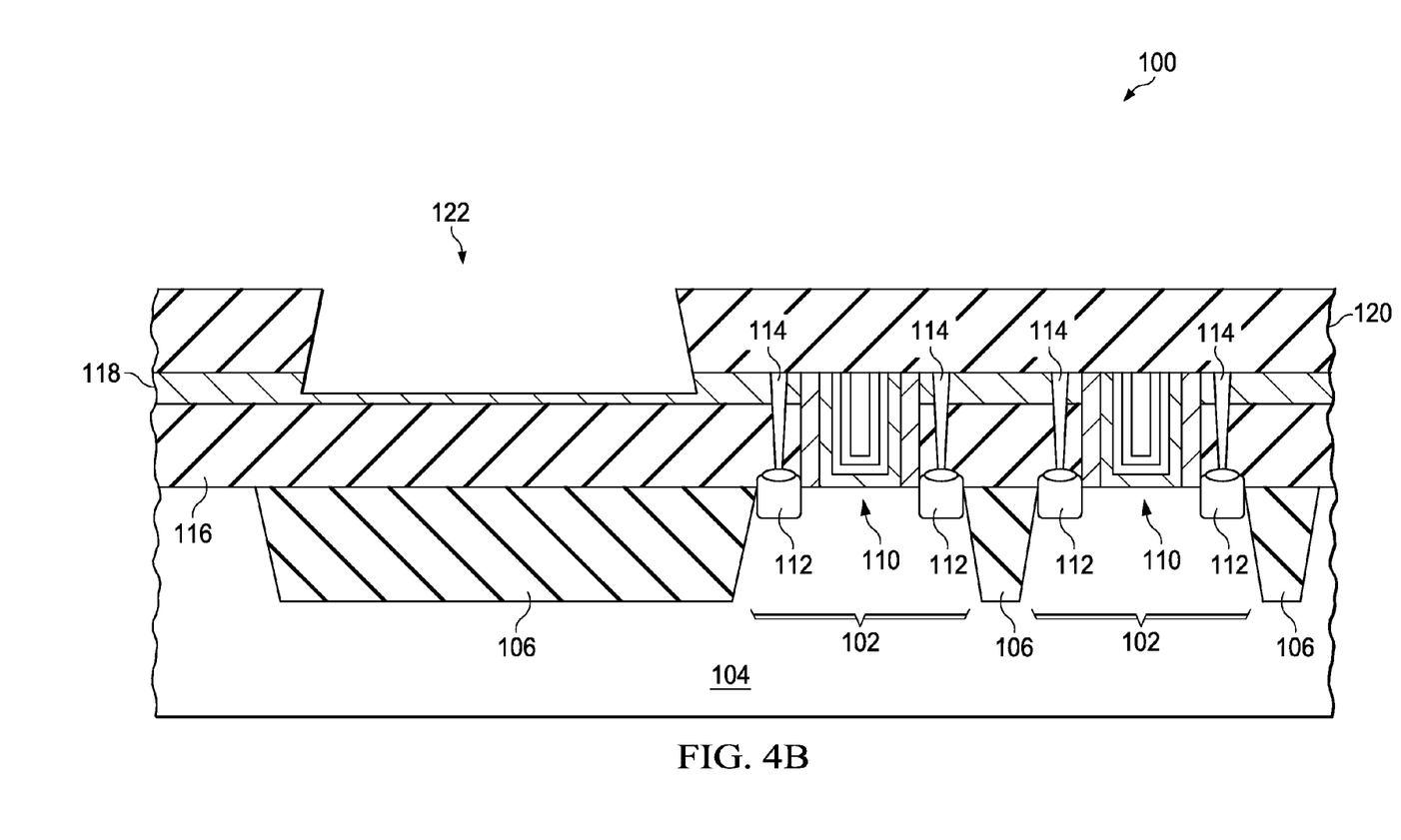

If desired, the sidewalls of the resistor trench 122 may be sloped as shown in FIG. 4B. By providing an inward slope, deposition of the resistor material on the trench sidewalls (discussed further below) may be avoided by a combination of RF power, etch chemistries and temperature modifications to result in a sloped sidewall.

Figure 5A:
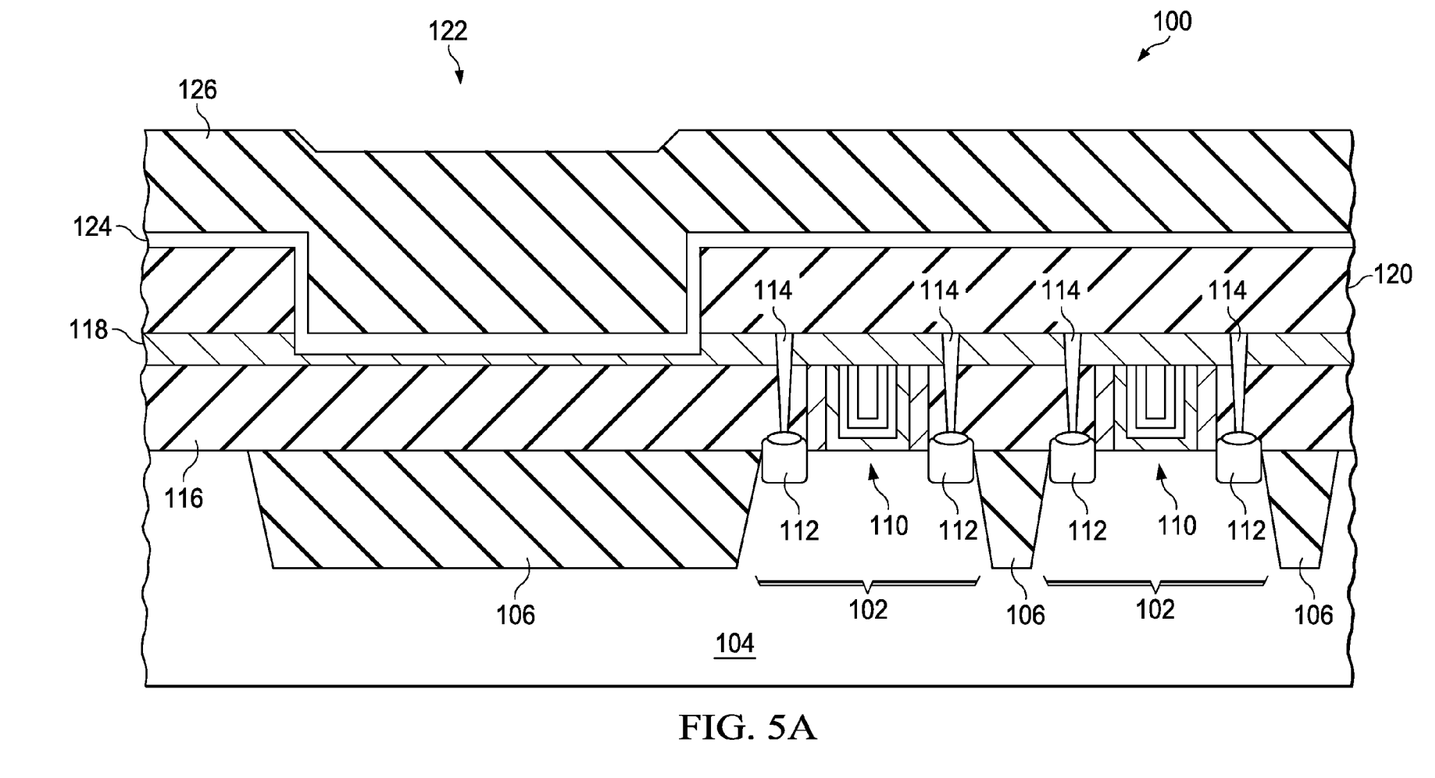

Referring to FIG. 5A, a layer of resistor material 124 is deposited. Resistor material 124 comprises SiCr. The thickness of resistor material 124 may, for example, be between 200 Å and 500 Å. Physical vapor deposition (PVD) using a SiCr target may be used to deposit resistor material 124. The PVD process may use a deposition gas mixture of Ar and $O_2$. The composition of the SiCr target may be adjusted to obtain the desired resistor characteristics. For high resistivity and low TCR, high Si contents are used with Cr in the target (e.g 72 wt % Si and 28 wt % Cr). Other compositions are available. Deposition rate can be altered with RF power, gas flows and chamber pressure. This can be used to vary the film thickness to achieve the desired resistor film parameters.

After deposition, the resistor material 124 is annealed to further adjust the resistor parameters to more closely match a polysilicon resistor if desired. For example, an Rs range between 200 o/sq and 400 ohms/sq (similar to polysilicon resistors) can be achieved by annealing the resistor material 124 at a temperature of 275° C. to 400° C. These temperatures are compatible with FEOL processing. The anneal conditions may also be selected to adjust the TCR. If the TCR is negative, the TCR can be moved to positive using an appropriate anneal temperature and ambient. For example, an ambient of $O_2$ or $CO_2$ can achieve +/−200 ppm/° C. By using appropriate deposition and anneal conditions a zero TCR can be achieved without impact to the transistors.

Figure 5B:
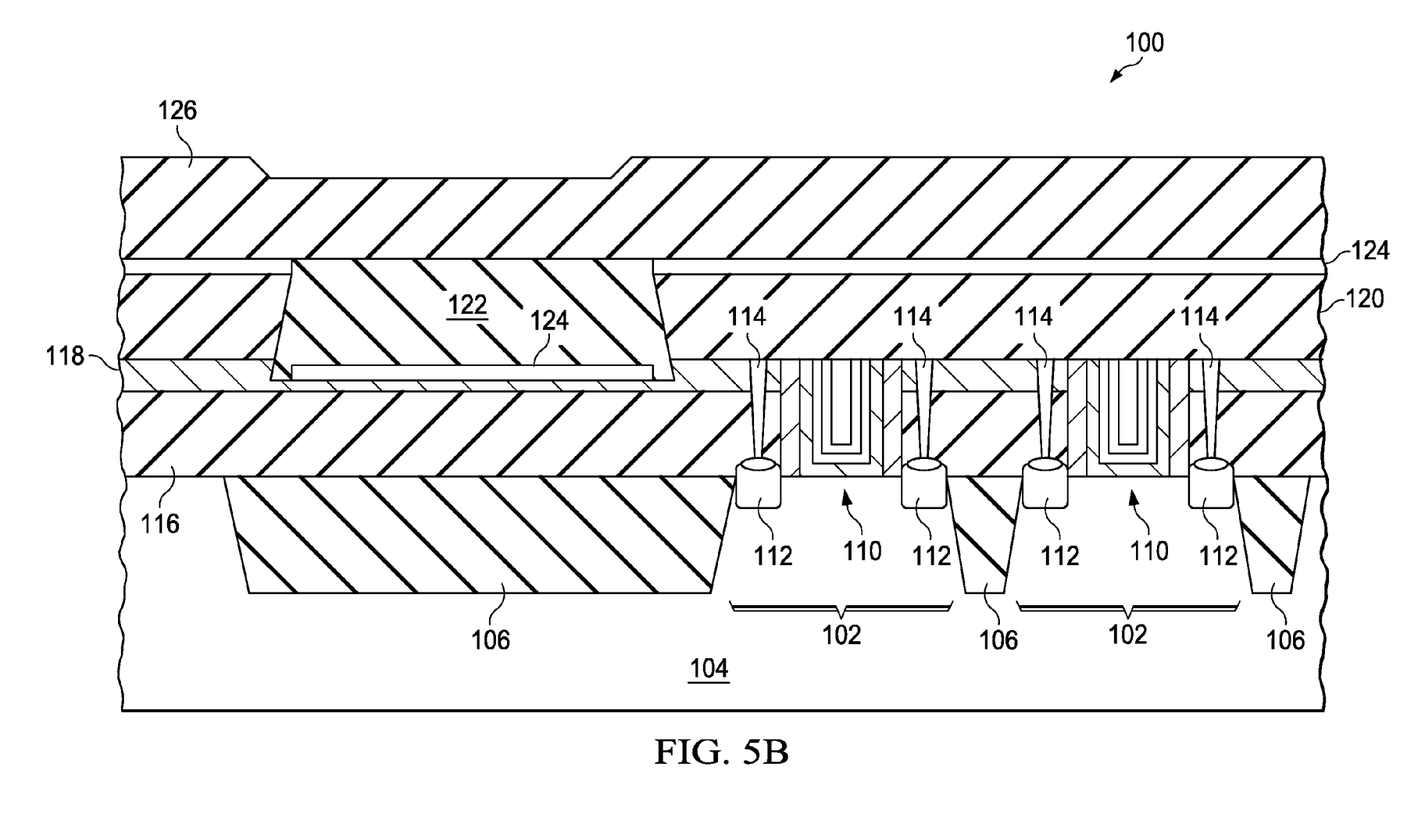

If the resistor trench 122 has inwardly sloping sidewalls as shown in FIG. 4B, the resistor material 124 may be deposited only on the horizontal surfaces as shown in FIG. 5B. This may be desirable if the thickness variation of the resistor material 124 on the sidewalls results in undesirable variation in resistor characteristics (e.g., resistance value, TCR, etc.).

Still referring to either FIG. 5A or 5B, a thick dielectric layer 126 is deposited over resistor material 124. Thick dielectric layer 126 overfills resistor trench 122. Thick dielectric layer 126 is preferably an oxide and may be formed using oxide deposition processes similar to those described above for dielectric layer 120. The thickness of dielectric layer 126 may be on the order of 1500 Å.

Figure 6:
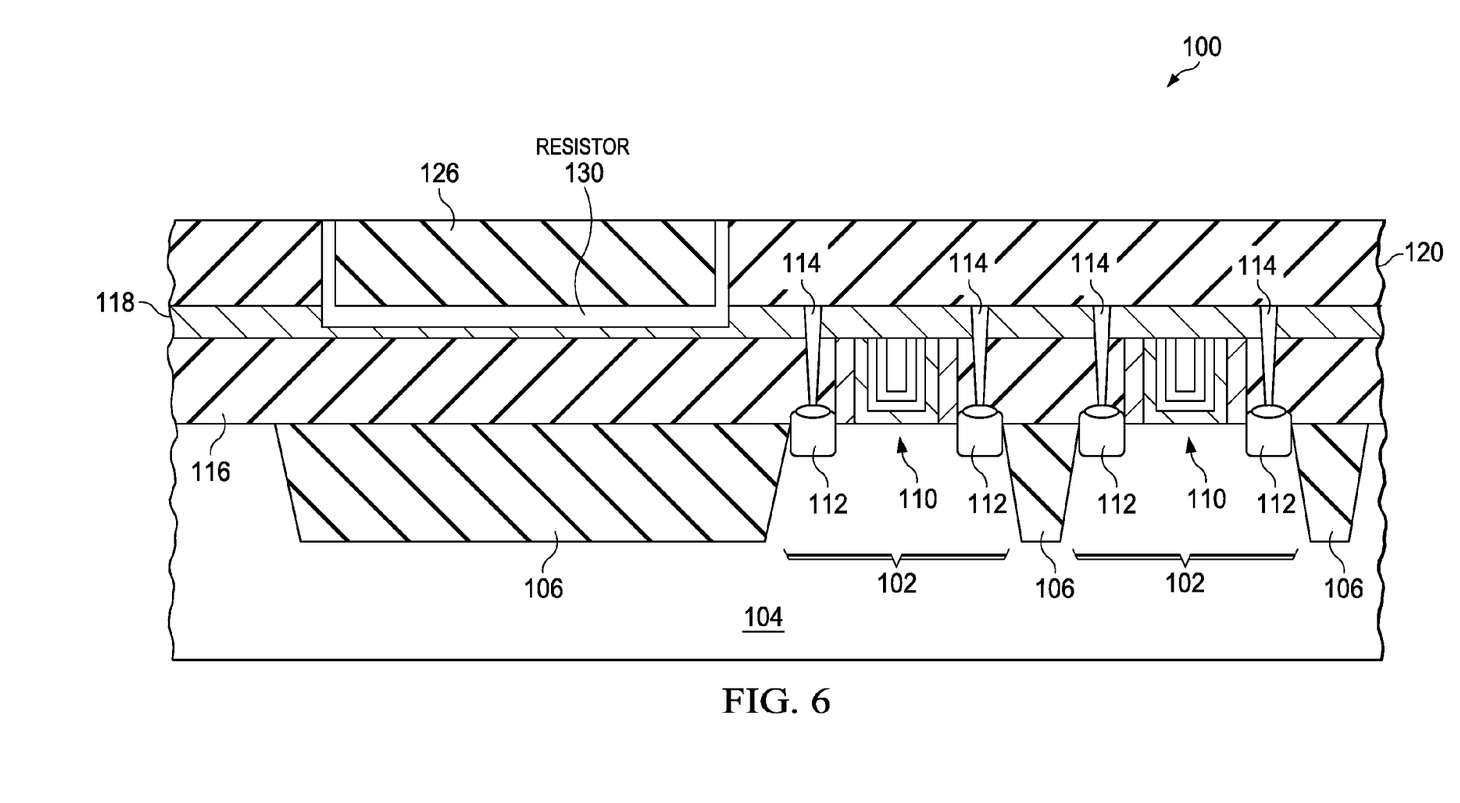

Referring to FIG. 6, a CMP process is performed to remove portions of dielectric layer 126 and portions of resistor material 124 over dielectric layer 120. The CMP process is continued into dielectric layer 120 leaving a planarized surface of a desired thickness above replacement gate 110. The desired thickness is selected based on the gate contact module and may be on the order of 400 Å to 700 Å. The portion of resistor material 124 remaining after the CMP process forms resistor 130. As shown in FIG. 6, resistor 130 is a trench resistor including a lateral portion at the bottom of the resistor trench and vertical portions on the sidewalls of the resistor trench. If the inwardly sloping sidewalls were used in resistor trench 122 as in FIGS. 4B and 5B, resistor 130 contains only the lateral portion and not the vertical portions.

After the CMP process, contacts 140 are formed in dielectric layers 120 and 126. Contacts 140 extend through dielectric layer 126 to the ends of resistor 130 and through dielectric layer 120 to replacement gate 110, as shown in FIG. 1. Contacts 140 may be formed by forming a photoresist pattern and etching contact holes where desired through dielectric layers 120 and 126 followed by filling the contact holes with conductive material such as TiN, W, TaN, Cu, or combinations thereof. Afterwards, the first level of metal interconnect 142 is formed over contacts 140. Processing then continues with the formation of additional levels of interconnect and packaging of the integrated circuit.

Figure 7:
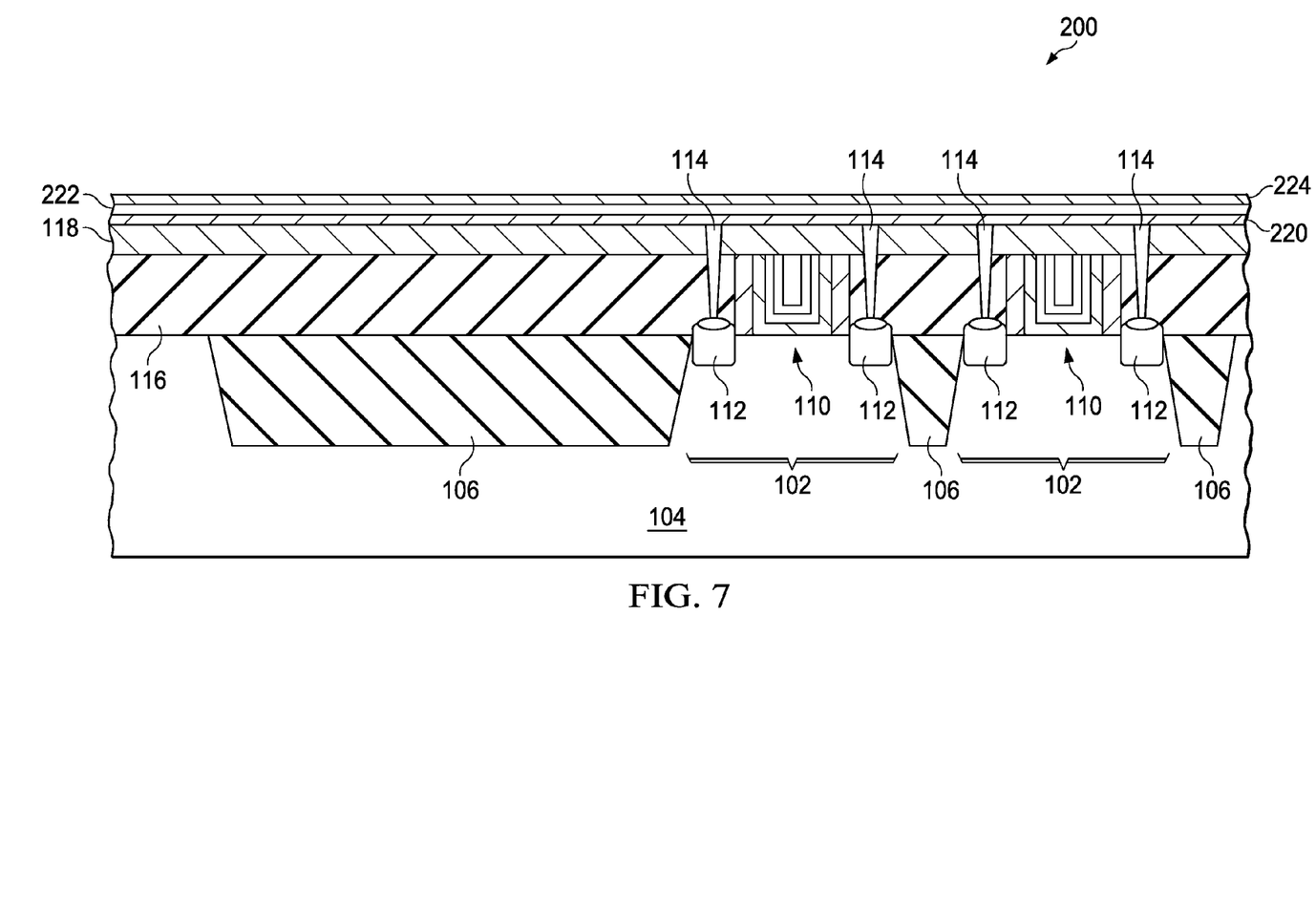
FIGS. 7-10 are cross-sectional diagrams illustrating an alternative method for integrating a front end SiCr resistor are various stages of fabrication.

Another method for integrating a front end SiCr resistor into the contact module of a replacement gate technology will now be discussed with reference to FIGS. 7-10. A partially fabricated integrated circuit 200 processed through the formation of replacement gate transistor 102 and first contact 114 to the source/drain regions 112 (such as that shown in FIG. 2 and discussed above) is provided. Referring to FIG. 7, a dielectric stop layer 220 is deposited on etch stop layer 118. Dielectric stop layer 220 may, for example, comprise a TEOS oxide. A layer of resistor material 222 is deposited over dielectric stop layer 220. Resistor material 222 comprises SiCr and may be formed using the deposition and anneal conditions described above with reference to resistor layer 122. An etch control layer 224 is optionally deposited over resistor material 222. Etch control layer 224 may comprise SiN, for example, and helps to control the RIE resistor etch described below.

Figure 8:
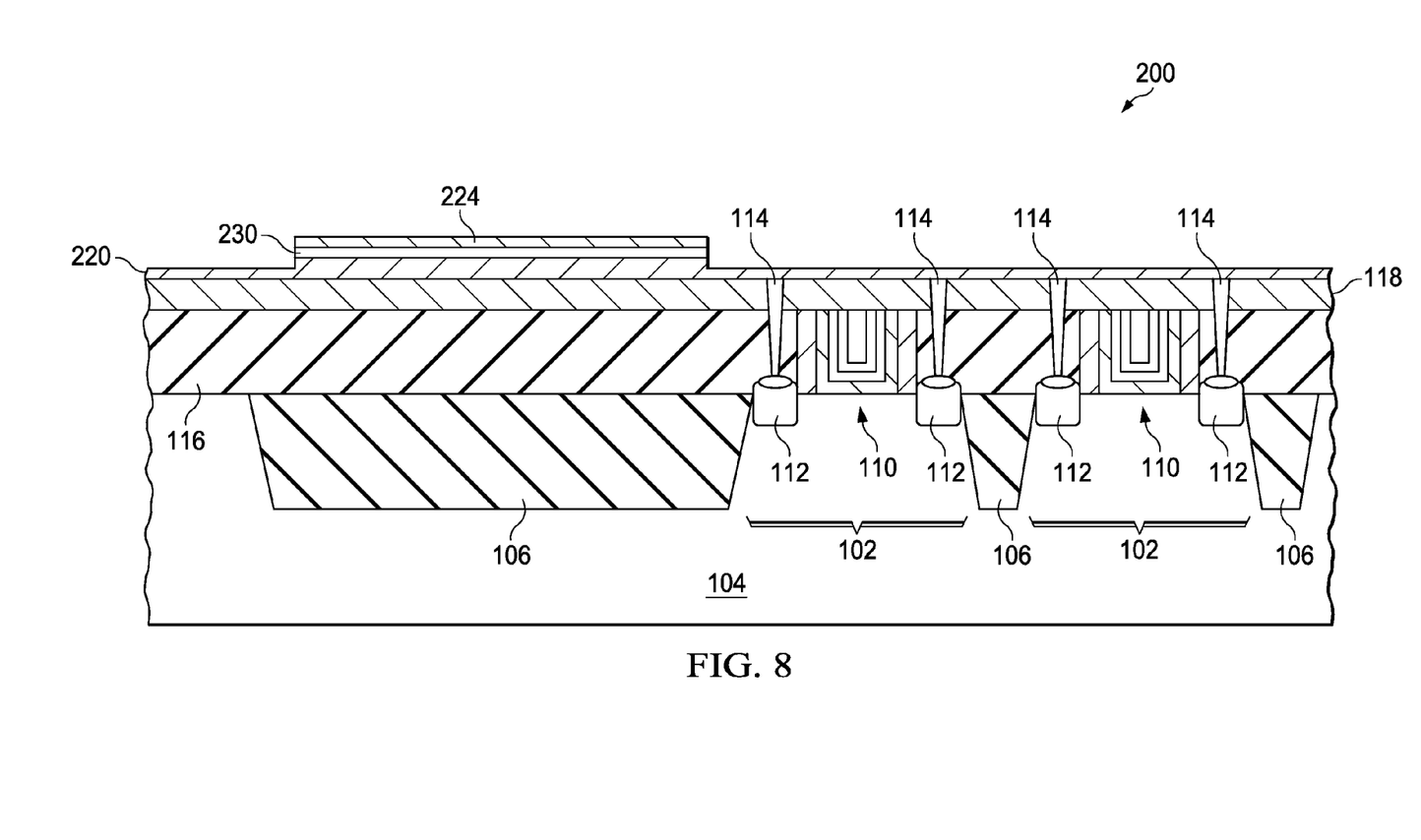

Referring to FIG. 8, the layer of resistor material 222 is patterned and etched along with etch control layer 224 (if present) to form resistor 230. An RIE may be used. The etch stops in dielectric stop layer 220, such that contacts 114 are not exposed to the RIE. RIE chemistry may include a 90%/10% $CF_4/O_2$ gas mixture. Other suitable etchants include mixed chemistries $Cl_2/BCl_3/SF_6$ or $CF_4/CHF_3$.

Figure 9:
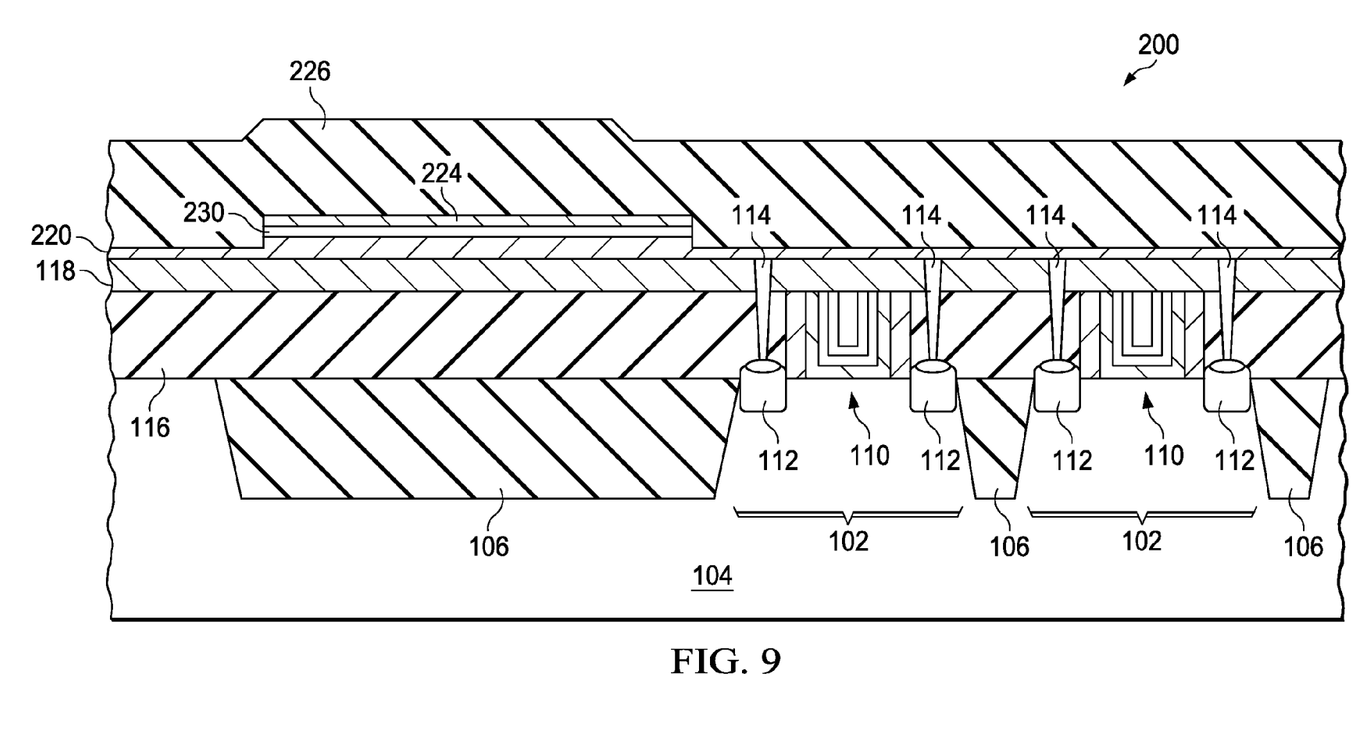

Referring to FIG. 9, a thick dielectric layer 226 is deposited over resistor 230. Thick dielectric layer 226 may for example comprise an oxide, such as a silicon dioxide formed by chemical vapor deposition (CVD), plasma enhanced chemical vapor deposition (PECVD) using tetraethyl orthosilicate, also known as tetraethoxysilane or TEOS, low pressure chemical vapor deposition (LPCVD), atmospheric pressure chemical vapor deposition (APCVD), high density plasma (HDP), or an ozone based thermal chemical vapor deposition (CVD) process, also known as the high aspect ratio process (HARP), a spin-on dielectric such as methylsilsesquioxane (MSQ), or other suitable dielectric layer formation process may be used.

Thick dielectric layer 226 is deposited to a thickness greater than that ultimately desired for the gate contact module to account for CMP uniformity issues created by the topology difference between areas with resistor 230 and areas outside of resistor 230. For example, the thickness of thick dielectric layer 226 may be on the order of 30% thicker than desired for the gate contact module.

Figure 10:
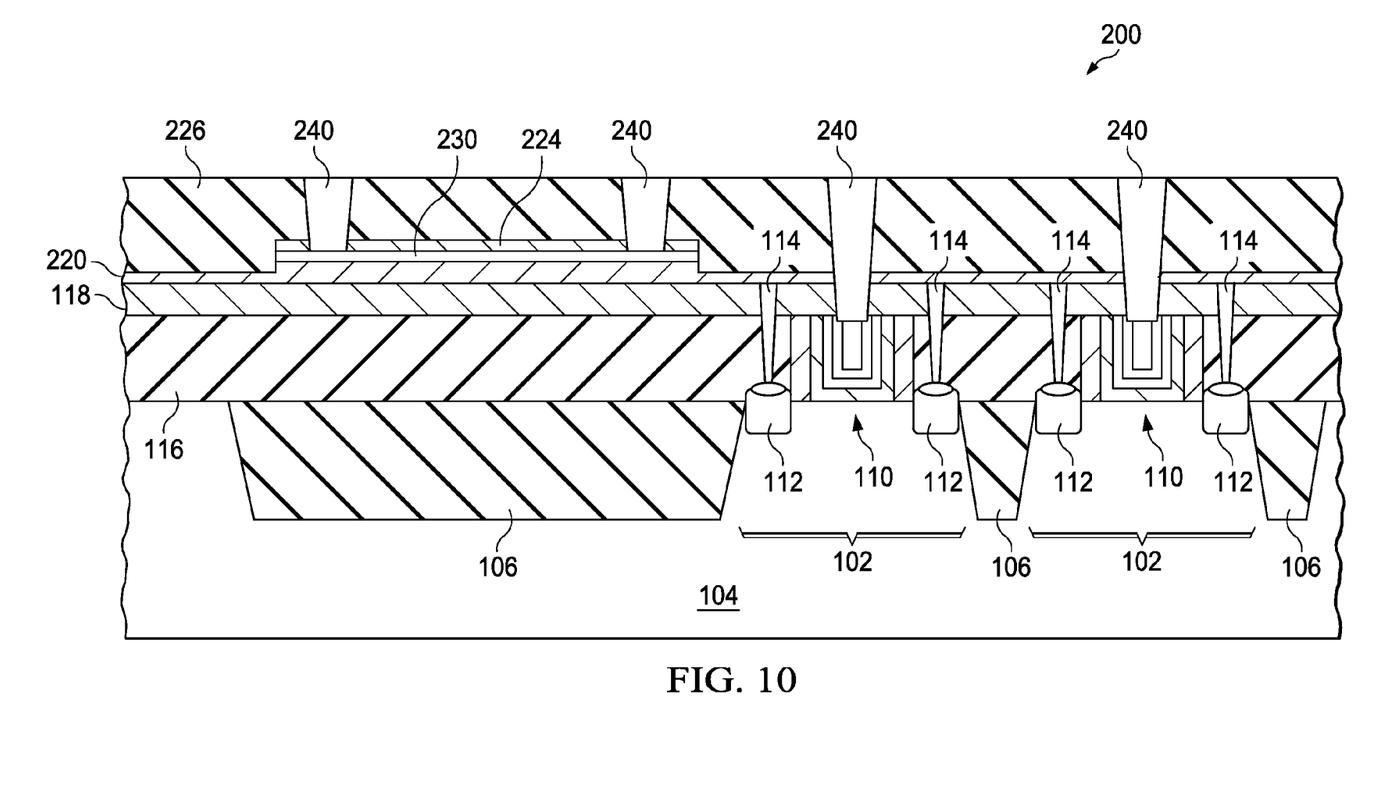

Referring to FIG. 10, a CMP process is performed to planarize the surface of integrated circuit 200. The CMP process removes any topography created by the insertion of resistor 230. Second contacts 240 are then formed through thick dielectric 226 to resistor 230 and replacement gate 110. Contacts 240 may be formed by forming a photoresist pattern and etching contact holes where desired through dielectric layer 226 followed by filling the contact holes with conductive material such as TiN, W, TaN, Cu, or combinations thereof. Afterwards, the first level of metal interconnect 142 is formed over contacts 240 as shown in FIG. 1. Processing then continues with the formation of additional levels of interconnect and packaging of the integrated circuit.

Figure 11:
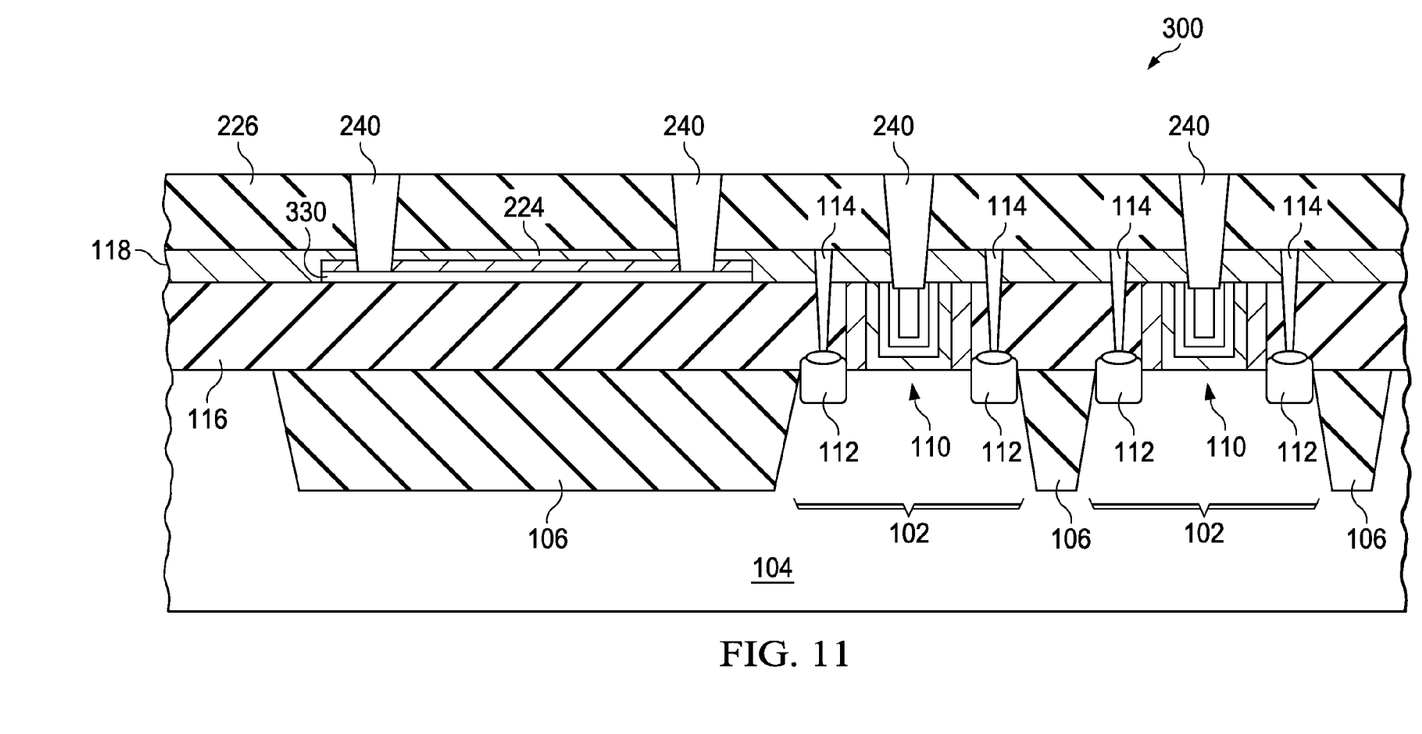
FIG. 11 is a cross-sectional diagram of an integrated circuit with a replacement gate transistors and an alternative integrated of a front end SiCr resistor.

If desired, the process for forming SiCr resistor 230 may instead be inserted into the contact module prior to the formation of first contacts 114 as shown in FIG. 11. The SiCr resistor material 226 (and optional etch control layer 224) is deposited, patterned, and etched to form resistor 330 after replacing the polysilicon gate with the replacement metal gate but before depositing the etch stop layer 118. After forming resistor 330, the etch stop layer 118 is deposited and first contacts 114 are formed. Dielectric layer 226 is then deposited and a CMP process is performed to planarize integrated circuit 300. Second contacts 240 are then formed through dielectric layer 226 and etch stop layer 118 to contact resistor 330 and replacement gate 110.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. An integrated circuit, comprising:
 a replacement HiK metal gate transistor having a metal gate and source/drain regions;
 a front end SiCr resistor;
 a first level of interconnect located over the replacement HiK metal gate transistor and the front end SiCr resistor;
 first contacts connected to said source/drain regions; and
 second contacts, wherein a first subset of said second contacts are connected between the first level of interconnect and the front end SiCr resistor and a second subset of said second contacts is connected between the first level of interconnect and the metal gate.

2. The integrated circuit of claim 1, wherein said front end SiCr resistor is a trench resistor including both a lateral portion and a vertical portion.

3. The integrated circuit of claim 1, wherein said front end SiCr resistor includes only a lateral portion.

4. The integrated circuit of claim 1, further comprising a shallow trench isolation (STI) region, wherein said front end SiCr resistor is located over said STI region.

5. The integrated circuit of claim 4, further comprising:
 a pre-metal dielectric layer (PMD) located over the STI region and an etch stop layer located over the PMD.

6. The integrated circuit of claim 5, wherein said front end SiCr resistor is located over said PMD layer and in contact with the etch stop layer.

7. The integrated circuit of claim 5, wherein the front end SiCr resistor is located above the etch stop layer.

8. The integrated circuit of claim 5, wherein the front end SiCr resistor is located below the etch stop layer.

9. A method of fabricating an integrated circuit comprising the steps of:
 forming a replacement HiK metal gate transistor on a substrate, wherein the replacement HiK metal gate transistor includes a metal replacement gate and a source/drain region;
 forming a first contact to connect to said source/drain region;
 forming a front end SiCr resistor;
 forming a plurality of second contacts wherein a first one and a second one of said plurality of second contacts connects to the front end SiCr resistor and a third one of said plurality of second contacts connects to the metal replacement gate; and
 forming a first level of interconnect over the plurality of second contacts and the front end SiCr resistor, wherein said first one and said second one of said plurality of second contacts electrically connects the first level of interconnect to the front end SiCr resistor and the third one of said plurality of second contacts electrically connects the first level of interconnect to the metal replacement gate.

10. The method of claim 9, wherein the step of forming the front end SiCr resistor comprises the steps of:
 forming a first dielectric layer over the first contact and replacement gate transistor;
 etching the first dielectric layer to form a resistor trench through the first dielectric layer;
 depositing a layer of SiCr over the first dielectric layer and in the resistor trench;
 depositing a second dielectric layer over the layer of SiCr, wherein the second dielectric layer fills the resistor trench;
 performing a chemical-mechanical polish (CMP) process to form a planarized surface, wherein the CMP process removes a portion of the second dielectric layer; a portion of the SiCr layer, and a portion of the first dielectric layer, and wherein a remaining portion of the SiCr layer forms the front end SiCr resistor.

11. The method of claim 10, wherein the front end SiCr resistor is a trench resistor and the remaining portion of the SiCr layer includes a lateral portion at a bottom of the resistor trench and a vertical portion on sidewalls of the resistor trench.

12. The method of claim 10, wherein said resistor trench has inward sloping sidewalls such that said SiCr layer is deposited on a bottom of the resistor trench and not on the inward sloping sidewalls.

13. The method of claim 9, wherein the step of forming the front end SiCr resistor comprises the steps of:
 depositing a layer of SiCr over the replacement gate transistor;
 etching the layer of SiCr to form the front end SiCr resistor.

14. The method of claim 13, further comprising the steps of:
 depositing a dielectric stop layer prior to depositing the layer of SiCr; and
 depositing a etch control layer over the layer of SiCr prior to etching the layer of SiCr.

15. The method of claim 13, wherein the step of forming the front end SiCr resistor occurs after forming the first contacts.

16. The method of claim 13, wherein the step of forming the front end SiCr resistor occurs prior to forming the first contacts.

17. The method of claim 9, wherein the step of forming the front end SiCr resistor includes depositing a layer of SiCr and annealing the layer of SiCr.

18. The method of claim 9, further comprising the step of forming a shallow trench isolation (STI) region, wherein the front end SiCr resistor is located over the STI region.

\* \* \* \* \*